(12) United States Patent
van Engelen

(10) Patent No.: US 7,042,375 B1
(45) Date of Patent: May 9, 2006

(54) SYSTEM AND METHOD USING DITHER TO TUNE A FILTER

(75) Inventor: Josephus A. van Engelen, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/091,909

(22) Filed: Mar. 29, 2005

(51) Int. Cl.
*H03M 1/20* (2006.01)

(52) U.S. Cl. .................. 341/131; 341/143; 341/155

(58) Field of Classification Search ........... 341/121, 341/131; 327/553
See application file for complete search history.

(56) References Cited

U.S. PATENT DOCUMENTS

| | | | | |
|---|---|---|---|---|
| 4,700,173 A | * | 10/1987 | Araki et al. ............... | 341/131 |
| 5,416,481 A | * | 5/1995 | Chen ........................ | 341/131 |
| 5,835,038 A | * | 11/1998 | Nakao et al. ............. | 341/131 |
| 6,351,229 B1 | * | 2/2002 | Wang ....................... | 341/143 |
| 6,462,685 B1 | * | 10/2002 | Korkala .................... | 341/131 |
| 6,680,682 B1 | * | 1/2004 | Arnaud et al. ............ | 341/155 |
| 6,771,199 B1 | | 8/2004 | Brooks et al. | |
| 6,774,830 B1 | | 8/2004 | Brooks | |

OTHER PUBLICATIONS

Crawford, D., *Adaptive Filters*, at http://www.spd.ee.strath.ac.uk/~david/adapt_filt/adapt_filt.html, 6 pages (Copyright 1996), no month.

* cited by examiner

*Primary Examiner*—Rexford Barnie
*Assistant Examiner*—Khai Nguyen
(74) *Attorney, Agent, or Firm*—Sterne, Kessler, Goldstein & Fox P.L.L.C.

(57) ABSTRACT

A system and method is used to tune filters, for example, analog filters in a sigma-delta modulator ADC. A known dither signal is used, for example a digital dither signal. Through adding of the dither to the modulator loop, the digital output of the sigma delta modulator ADC contains a filtered version of the digital dither. This signal can be used to reveal characteristics of the modulator-loop, including characteristics of a continuous-time filter in the modulator. Therefore, using the known digital dither signal and the output signal of the modulator, the continuous-time loop filter can be tuned. The tuning can be done in multiple ways, for example, by using standard LMS adaptive filter techniques to estimate the actual response of the continuous-time loopfilter and adjust the continuous-time loopfilter to the desired response.

20 Claims, 6 Drawing Sheets

SYSTEM AND METHOD USING DITHER TO TUNE A FILTER

BACKGROUND

1. Field

The present invention is related to tuning an analog filter, and more specifically, to tuning an analog filter in a sigma-delta modulator.

2. Related Art

Many signals in communications are analog and narrowband. In order to process them digitally, they need to be converted by an analog-to-digital converter (ADC). A sigma delta ($\Sigma\Delta$) modulator ADC (e.g., a band pass sigma delta modulator) is particularly suited for converting narrow-band signals (e.g., narrow-band frequency signals) from analog to digital. In some sigma delta modulators with analog loop filters, integrated circuit implementations suffer from process and component value variation causing the filters to need tuning.

One way of tuning the analog loop filter is by making a second implementation of the filter (i.e., a master filter), and tuning the master filter, e.g. with a pilot tone. The filter in the modulator is then slaved off of the master filter. This is sometimes referred to as a form of background tuning, as it does not interrupt normal operation. However, not only is an additional filter needed (e.g., more area and power are lost on a chip), but the accuracy of the tuning is limited by matching of the components between the two filters.

Another way would be to take the filter out of the signal-path and tune it periodically. This is sometimes referred to as foreground tuning. However, this interrupts normal system behavior. In some application, this interruption can be prohibitive.

Therefore, what is needed is a system and method that would allow for more efficient and effective tuning of an analog filter.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
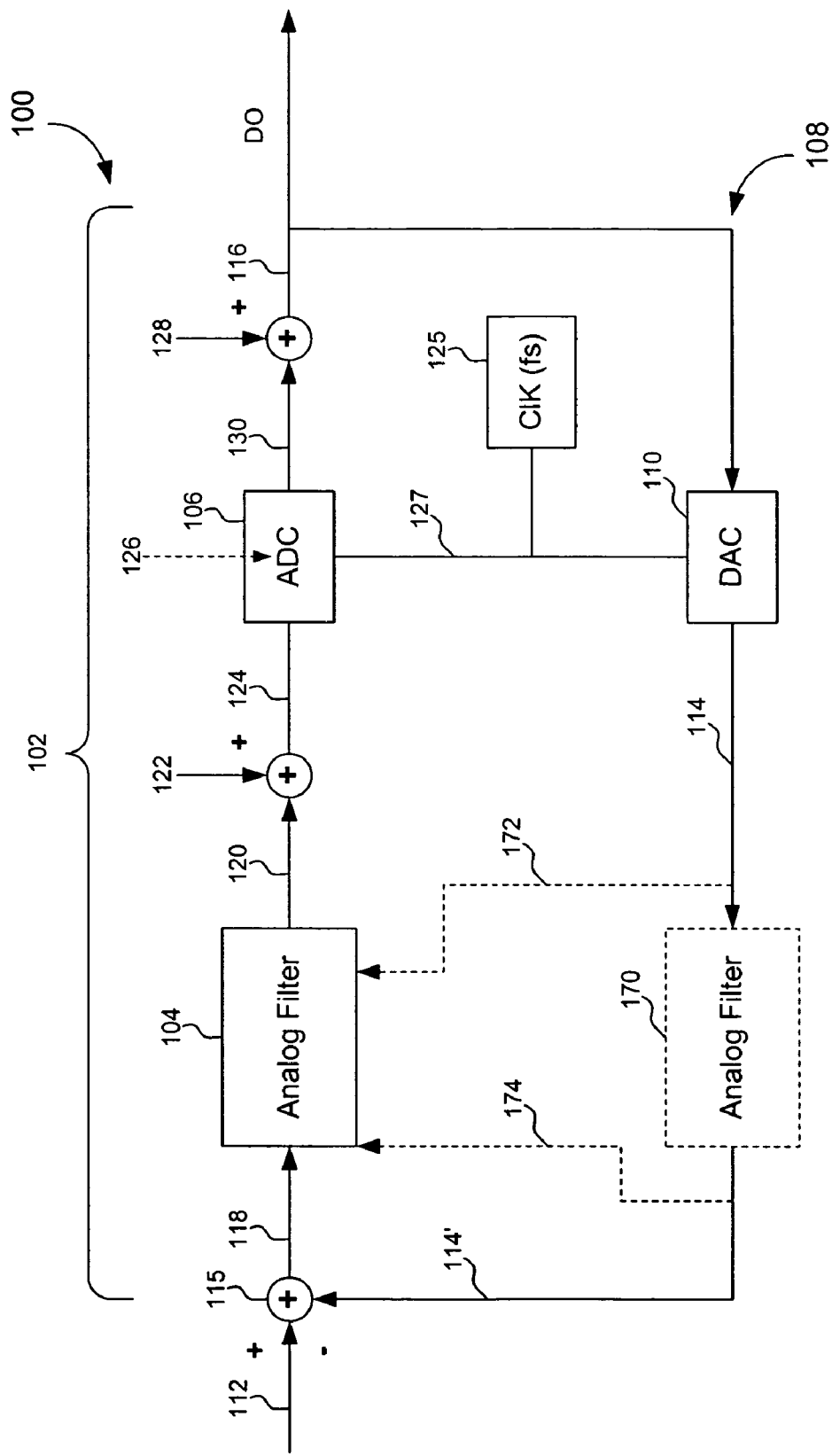
FIG. 1 shows a system, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a system and method for tuning filters, for example, analog filters in a sigma-delta modulator ADC. A dither signal having known properties is used, for example a digital dither signal. Through adding of the dither to the modulator loop, the digital output of the sigma delta modulator ADC contains a filtered version of the digital dither. This signal can be used to reveal characteristics of the modulator-loop, including characteristics of a continuous-time filter in the modulator. Therefore, using the digital dither signal having known properties and the output signal of the modulator, the continuous-time loop filter can be tuned. In various embodiments, the tuning can be done in various ways, for example, by using standard LMS adaptive filter techniques to estimate the actual response of the continuous-time loopfilter and adjust the continuous-time loopfilter to the desired response.

In various examples, the above arrangement allow for achieving relatively very high accuracy in tuning the filter to a desirable gain or frequency.

Exemplary Sigma-Delta Modulator

FIG. 1 shows a system 100, according to one embodiment of the present invention. System 100 includes a sigma-delta modulator 102 that has an analog filter 104, an analog-to-digital converter 106, and a feedback loop 108 with a digital-to-analog converter 110. For example, modulator 102 can be a noise-shaping sigma delta modulator analog-to-digital converter (ADC), in which oversampling feedback is used to reduce the quantization errors of a coarse quantizer within a narrow frequency band of interest.

In the example shown, an analog input 112 is compared with an analog representation 114' of a digital output 116 at summer or adder 115. An error signal 118 is then filtered to produce a filtered signal 120. This can be done using analog filter 104 having a filter function G, which can, for example, be used to only pass the errors within a frequency band of interest.

In one example, signal 112 can be formed by an audio signal, a modulated signal (e.g., an analog signal modulated on a carrier signal), such as an AM or FM radio signal, a video signal, or other narrow band signals.

In one example, digital output signal 116 is further processed, for example decimated, filtered, signal processed, etc., and then transmitted to an device that uses the signal, such as an audio output device.

Some sigma-delta modulators can have undesirable idle patterns and tones, and other undesirable distortions that can appear in the output of the modulator that were not in the input signal. Dither can be used to improve the performance of the sigma-delta modulator 102 through adjusting of the output signal until the undesirable distortions are no longer perceived as a problem. A dither signal can be generated in various ways, such as using a pseudo random bit sequence generator, or the like. In one example, a dither signal is a "white noise" signal.

In one example, an analog dither 122 is added to filtered error signal 120 resulting in an input signal 124 that is input to ADC 106. ADC 106 quantizes input signal 124 to M digital values (M being an integer greater than or equal to 1) at a rate of fs per second, fs being a clock frequency input 127 from clock 125. In one example, that this can be represented as adding a quantization error 126 to signal 124.

In one example, a digital dither signal 128 may be added to an output signal 130 of ADC 106 to result in a digital output 116 of modulator 102, which in turn drives the N level feedback DAC 110 (generally N=M+number digital dither levels).

In various examples, signal 128 can be any type of digital signal, and not just a dither signal. Signal 128 must conform to a signal that is inserted into modulator 102 and has an effect on modulator output 116, such that sufficient information about the modulator noise transfer function or loop-filter can be obtained. The use of various types of digital signal is also true of the other embodiments, discussed in more detail below.

Thus, dither signals 122 and/or 128 can be added to improve the behavior of the modulator 102. For example, as discussed above, to prevent idle patterns and tones. In various examples, either one or both signals may be present in a modulator.

In one example, mathematically the modulator output can be described by the following equation:

$$\text{Modulator Output 116} = \frac{G'}{(1+F)*\text{Analog Input 112}} + \frac{1}{(1+F)*\text{Quantization Signal 126}} + \frac{1}{(1+F)*\text{Analog Dither 122}} + \frac{1}{(1+F)*\text{Digital Dither 128}}$$

in which G' is the equivalent mixed time-domain transfer function of the analog filter G, and F is the equivalent discrete time transfer function of the combination of the DAC response (i.e., waveform) and the analog filter G.

The signal transfer function from analog signal 112 to modulator output 116 is near unity when the absolute value of G' (and as a result F) is large within the band of interest. In that case, the noise transfer function from quantization error 126 and dither signals 122 and 128 will be very small. That is, the quantization errors and dither signals will be suppressed within the frequency band of interest.

Solid state analog sigma-delta modulator implementations, and in particular with continuous time filter implementations of G, can have variation of the filter G due to component variations, which can be up to 30%, for example. In the case of a bandpass modulator ADC, this means that the "tuning frequency" in which the bandpass filter G has a high gain can vary significantly. This can cause errors when the desired frequency band of interest is fixed.

In one example, modulator 102 can have an additional analog filter 170 in the feedback path 108 between DAC 110 and adder 115, for example.

In another example, analog filter 104 can have separate inputs for DAC feedback signal 114 and analog input 112, as shown by dashed lined paths 172 and 174. Path 172 is used when no filtering is performed of signal 114, while path 174 is used when signal 114 is filtered using analog filter 170 before signal 114 enters filter 104. In either case, adder 115 at the input of modulator 102 is removed such that the filter input signal 118 is equal to the modulator input signal 112.

Exemplary Filter Tuning System

Figure 2:
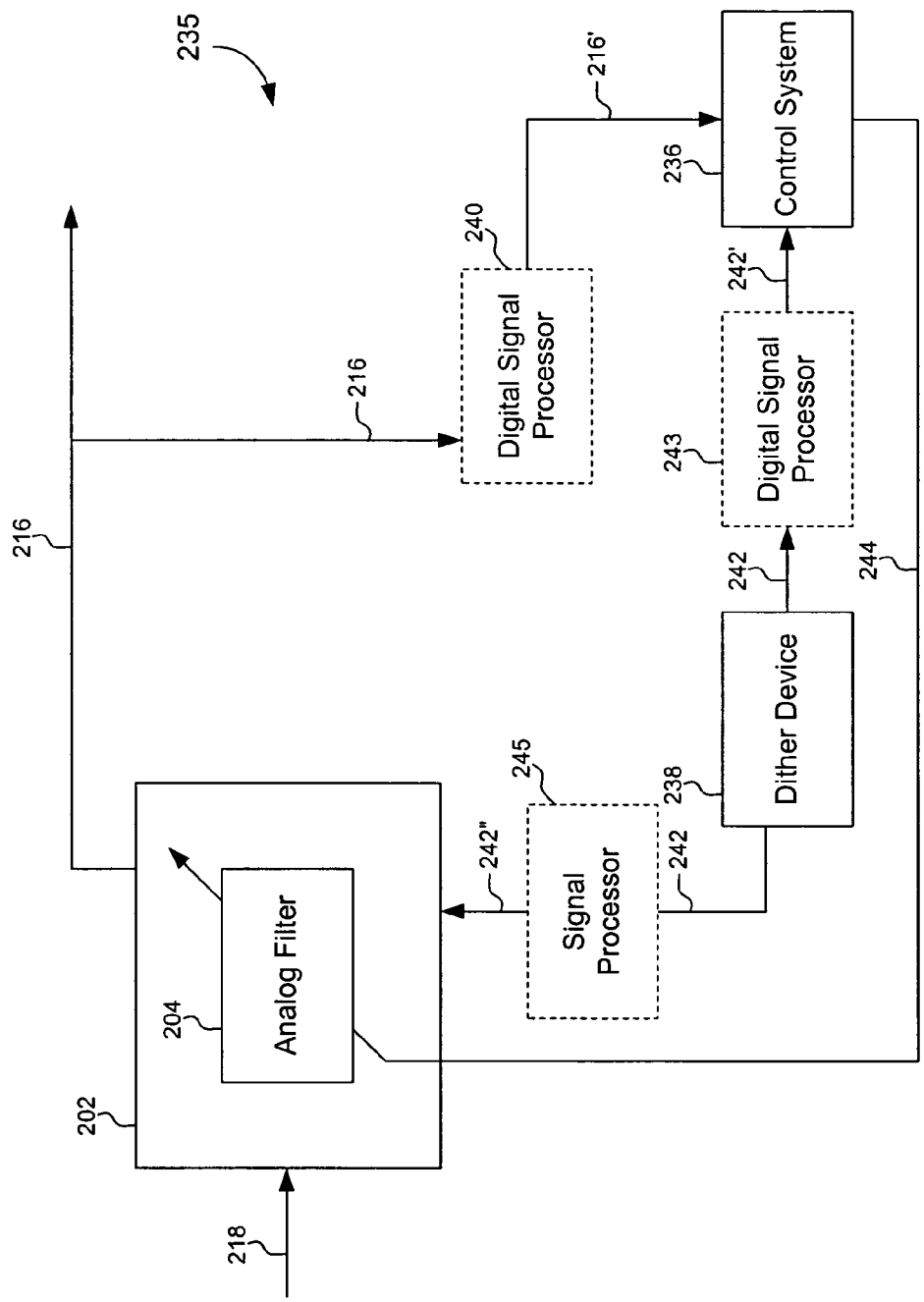
FIG. 2 shows an analog filter tuning system, according to one embodiment of the present invention.

FIG. 2 shows an analog filter tuning system 235, according to one embodiment of the present invention. Filter tuning system 235 includes a control system 236 and a dither device 238. In one example, filter tuning system 245 also includes one or more digital signal processors 240 and/or 243, which can, for example, delay or filter a digital modulator output signal 216 and/or digital dither signal 242. In alternative examples, processed dither signal 242" processed using signal processor 245 is received at modulator 202, which can be, for example, an analog representation of dither signal 242, or the like. Control system 236 receives either modulator output signal 216, or a processed output signal 216', and a dither signal 242. In alternative examples, a processed dither signal 242' processed using digital signal processor is received at modulator 202, which can be, for example, an analog representation of dither signal 242, or the like. Based on these signals, control system 236 generates a control signal 244, which is used to tune analog filter 204. For example, a continuous tuning of analog filter 204 can be accomplished using analog filter tuning system 235.

In an example when dither device 238 produces a digital dither signal 242, since digital dither signal 242 is known, and a processed digital output 216' of modulator 202 is also known, it is possible to obtain information about the noise transfer function 1/(1+F) and/or analog filter 204 when processed signal 216' contains a filtered version of dither signal 242 (e.g., when 216'=216).

In one example, the tuning or control of modulator 202 by digital control signal 244 could be fully digital, where components are switched in and out of analog filter 204 of modulator 202 to change its behavior. In another example, the tuning of control of modulator 202 could be analog, where control signal 244 is converted to an analog control signal, which varies the behavior of filter 204 of modulator 202 in a continuous/analog sense.

In one example, control system 236 that "tunes" or controls modulator 202 could use multiple modulator output signals 216/216' and/or multiple dither signals 242 as its inputs, and/or could generate multiple modulator control signals 244 that change the modulators behavior.

Figure 3:
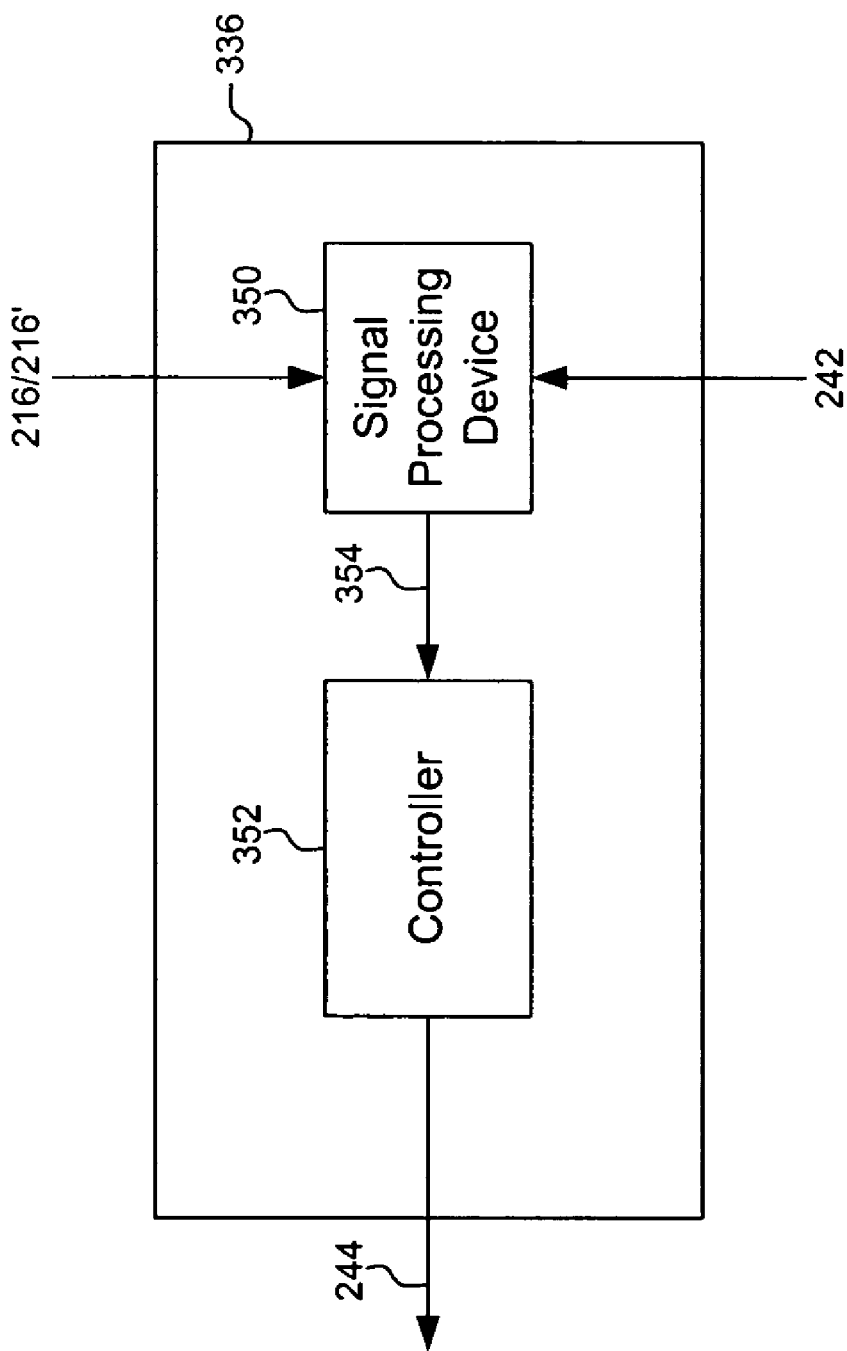
FIG. 3 shows a control system in the analog filter tuning system, according to one embodiment of the present invention.

FIG. 3 shows a control system 336, according to one embodiment of the present invention. Control system 336 can be used in analog filter tuning system 235 shown in FIG. 2. Control system 336 includes a signal processing device 350 (e.g., a filter system, a filter and adaptation system, etc.) and a controller 352. Signal processing device 350 receives modulator output 216 (or processed modulator output 216') and/or dither signal 242. Using these signals, a processed signal 354 is output to controller 352, which is discussed in more detail below. Controller 352 uses processed signal 354 to produce control signal 244. Exemplary control system signal processing devices are shown in FIGS. 4 and 5, discussed below.

In one example, control system 336 is used to determine an estimate of filter characteristics of analog filter 204. This is done by estimating a noise transfer function, which is used to estimate the characteristics of analog filter 204, which is then used to control modulator 202.

Exemplary Filter Systems in Exemplary Filter Tuning Systems

Figure 4:
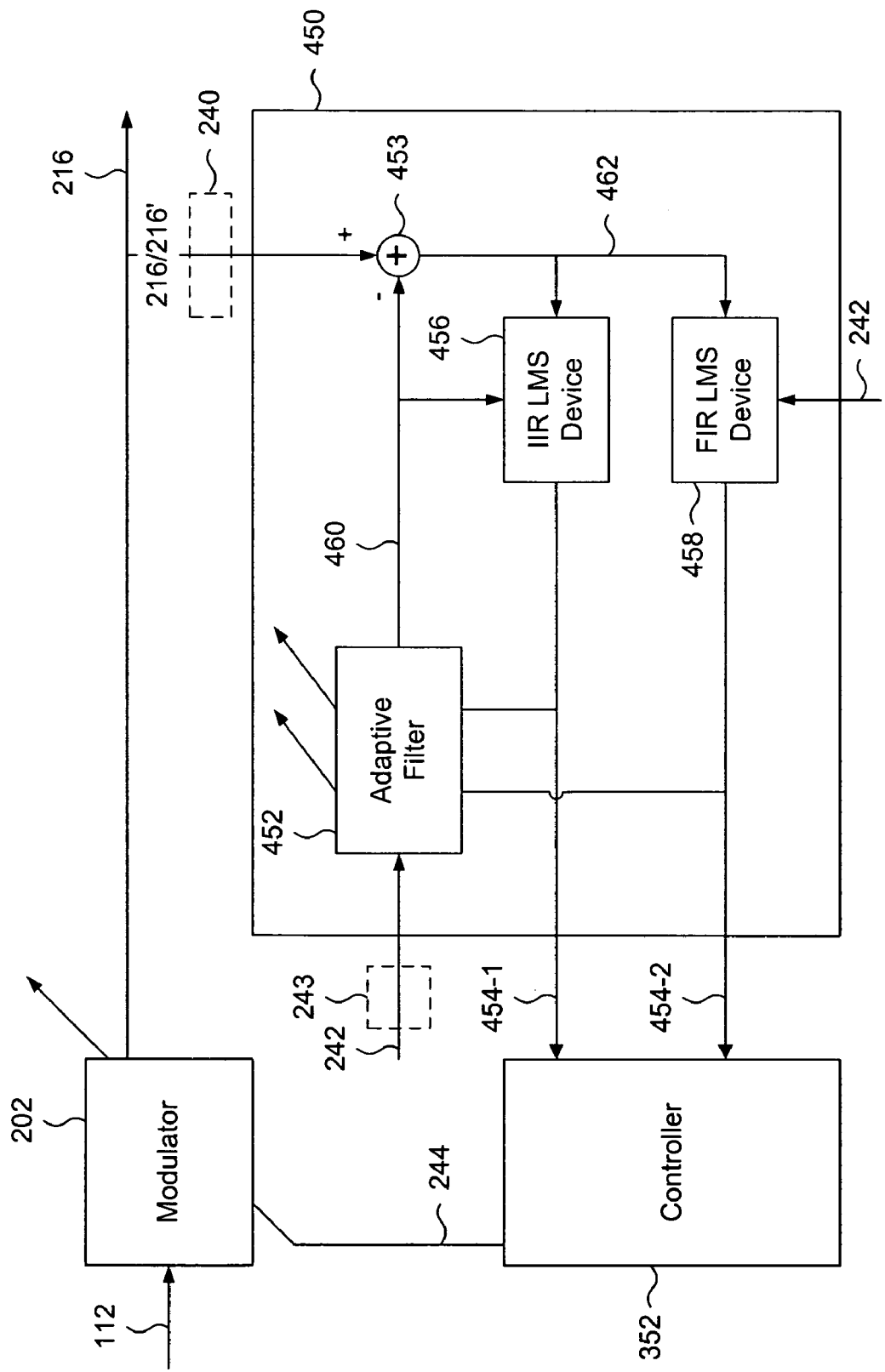
FIGS. 4 and 5 show various filter systems in the control system of FIG. 3, according to various embodiments of the present invention.
Figure 5:
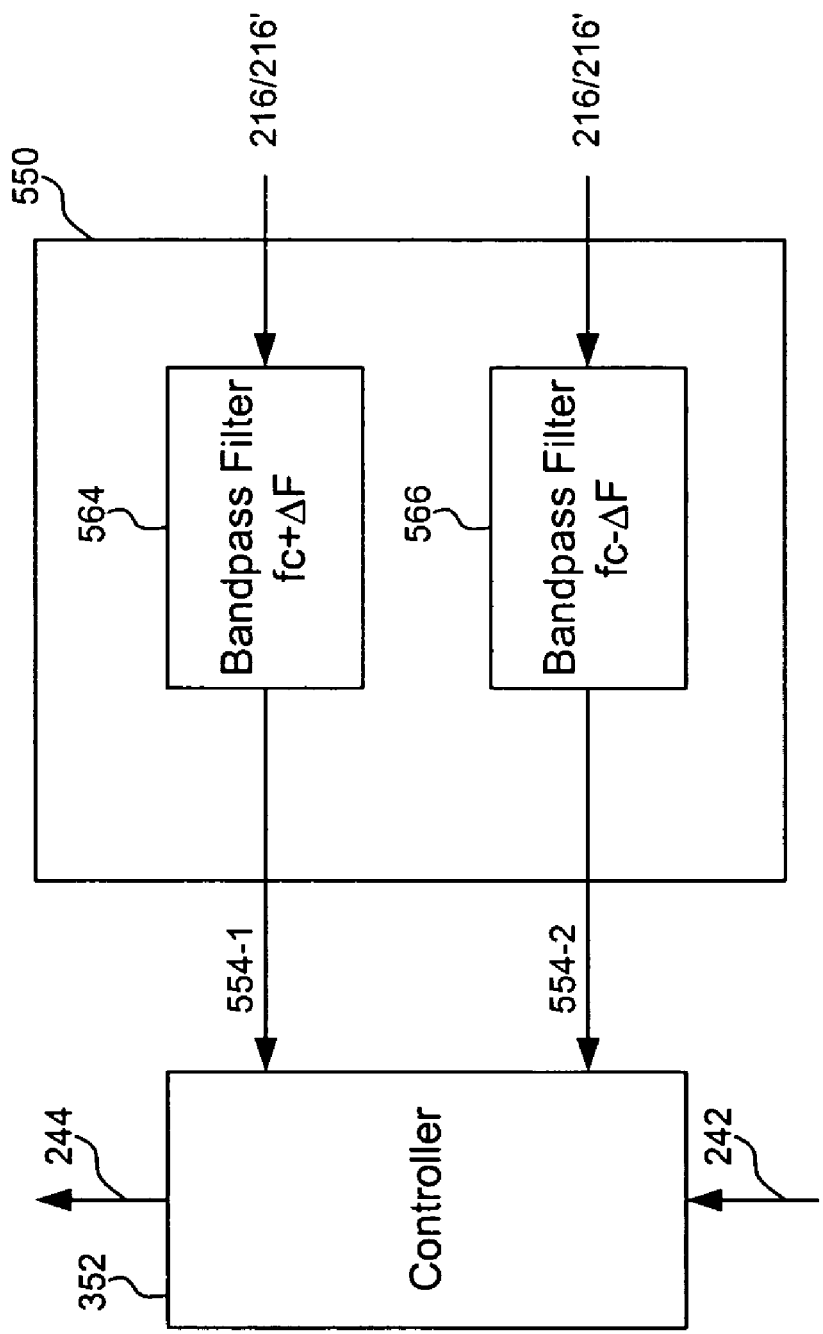

FIGS. 4 and 5 show various signal processing devices 450 and 550, according to various embodiments of the present invention. FIG. 4 shows a system using a least mean squares (LMS) filter estimation and extraction of the filter characteristics to control analog filter 104. FIG. 5 shows a system using two passband filters to filter modulator output 216 (or 216') at frequencies above and below the frequency band of interest and to adjust analog filter 104, such that the average correlations with the digital dither of the two filtered outputs have equal energy.

Turning first to FIG. 4, signal processing device 450 (e.g., a filter and adaptation system) includes an adaptive filter 452, a summer or adder 453, an IIR LMS (infinite impulse response least mean squares) adaptation device 456, and a FIR LMS (finite impulse response least mean squares) adaptation device 458. Adaptive filter 452 has a filter function of $H_{LMS}$ (discussed in more detail below), which is an estimate of the noise transfer function 1/(1+F) of modulator 202 on dither signal 242. In various examples, adaptive filter 452 could be an FIR or IIR filter. Adaptive filter 452 produces a filtered version 460 of dither signal 242. The use of an angled arrow through adaptive filter 452 signifies that inputs from FIR and IIR devices 456 and 458 are used to adjust coefficients in adaptive filter 452, and not to add or remove signals (e.g., not to contribute to the signal path). Thus, signals 454-1 and 454-2 (discussed below) are used to change way signal 460 is created from signal 242 based on adjusting coefficients.

Filtered dither signal 460 is compared to (e.g., subtracted from) modulator output signal 216 (or processed modulator output signal 216') using summer 453 to produce an error signal 462. The error signal is formed because analog filter 204 produces modulator output signal 216 partially based on filtering dither signal 242. In one example, this error signal 462 converges to contain minimum energy from dither signal 242.

Error signal 462 is received by both IIR LMS device 456 and FIR LMS device 458. IIR LMS device 456 receives both error signal 462 and filtered dither signal 460, and produces a filtered/control signal 454-1 therefrom. FIR LMS device 458 receives both error signal 462 and dither signal 242, and produces a filtered/control signal 454-2 therefrom. These signals 454-1 and 454-2 are then received by both the controller 352 to produce a control signal 244 and by adaptive filter 452 to adapt the coefficients in adaptive filter 452 to minimize error signal 462. Thus, IIR LMS device 456, FIR LMS device 458, and summer 453 form a feedback loop for adaptive filter 452 to continuously adjust signal 460, such that signal 460 begins to resemble a filtered dither signal that appears in modulator output signal 216.

In one example, least mean squares (LMS) methods are used to estimate the noise transfer function 1/(1+F) and adjust components/coefficients/variables of adaptive filter 452 (and indirectly analog filter 204 through controller 352) to tune it to an application specific correct frequency, gain or bandwidth, etc. The LMS (least mean squares) algorithm is an approximation of the steepest descent algorithm, which uses an instantaneous estimate of the gradient vector of a cost function. The estimate of the gradient is based on sample values in filtered signal 460 of adaptive filter 452 and an error signal 462. The algorithm iterates over each coefficient in adaptive filter 452, moving adaptive filter 452 in the direction of the approximated gradient. The LMS algorithm uses a reference signal representing the desired filter output. The difference between the reference signal and an actual output of the adaptive filter is the error signal. The task of the LMS algorithm is to find a set of filter coefficients that minimize the expected value of the quadratic error signal, i.e., to achieve the least mean squared error.

Thus, adaptive filter 452 is controlled by IIR LMS device 456 and FIR LMS device 458. Also, IIR LMS and FIR LMS control signals 454-1 and 454-2 are sent to controller 352, which determines how to adjust modulator 202 using control signal 244.

In one example, if filtered dither signal 460 is an accurate estimate of the dither signal 242 in the modulator output signal 216 or 216', filtered dither signal 460 can be subtracted from processed signal 216 in order to remove the added noise from dither signal 242, which may improve the performance of modulator 202.

In one example, $H_{LMS}$ is an FIR or IIR filter and can be described in terms of it's z-domain transform:

$$H_{LMS}(z)=HN(z)/HD(z)$$

where HN(z) and HD(z) are polynomials of $z^{-1}$ with coefficients $hn_{0 \ldots j}$ and $hd_{0 \ldots j}$ respectively, with j the order of the filter.

In this case the LMS devices can be described by:

$$hn_{0 \ldots j}[k]=hn_{0 \ldots j}[k-1]-2*\mu n*(\text{Signal } 216[k]-\text{Signal } 460[k])*\text{Signal } 242[k:k-j]$$

$$hd_{1 \ldots j}[k]=hd_{0 \ldots j}[k-1]-2*\mu d*(\text{Signal } 216[k]-\text{Signal } 460[k])*\text{Signal } 460[k-1:k-j]$$

$$hd_0[k]=hd_0[k-1]=1$$

in which μn and μd are the LMS update coefficients.

In one example, the $hn_{0 \ldots j}[k]$ portion of the above equations is also used in FIR LMS device 458 and the $hd_{1 \ldots j}[k]$ and $hd_0[k]$ portions of the above equations are also used in IIR LMS device 456.

In one example, both dither signal 242 and modulator output signal 216 can be pre-filtered with identical filters 240 and/or 243 (FIG. 2) before being received at signal processing device 450, for example, in order to improve the performance of the tuning (e.g., faster settling, higher immunity to interfering signals, etc.).

In one example, in operation adaptive filter $H_{LMS}$ will start to resemble the modulator noise transfer function. When this is known, controller 352 determines whether function G of analog filter 202 in modulator 204 is tuned to a correct frequency. If it is not, control signal 244 is used to adjust parameters of function G of analog filter 204 in modulator 202. This changes the noise transfer function of modulator 202. Then, the $H_{LMS}$ of adaptive filter 452 is also changed to adapt to the new modulator noise transfer function. This continues until G and $H_{LMS}$ converge to the desired transfer function or tuning frequency.

It is to be appreciated that in alternative examples, signal processing device 450 may include only one of IIR LMS device 456 and FIR LMS device 458, and not both devices.

With reference now to FIG. 5, signal processing device 550 (e.g., a filter system) is used instead of signal processing device 450 in FIG. 4. Signal processing device 550 includes first and second bandpass filters 564 and 566, respectively. First bandpass filter 564 filters modulator signal 216 (or processed signal 216') using a passband defined by fc+ΔF. Here, fc is the desired center frequency of analog filter 204 in modulator 202 and the desired tuning frequency of the noise transfer function of modulator 202, and ΔF is the (positive) offset frequency of bandpass filter 564 with respect to fc. Similarly, second bandpass filter 566 filters modulator signal 216 (or processed signal 216') using a passband centered at fc-ΔF. Here, ΔF is again the offset frequency of the bandpass filter 566 with respect to the desired tuning frequency fc. Resultant filter signals 554-1 and 554-2 are received at controller 352, and along with dither signal 242, are processed in the controller to produce control signal 244. For example, an energy value of dither signal 242 within these two signals 554-1 and 554-2 is determined. If the energy value is substantially identical in both signals, then known analog filter 204 is tuned to the correct value fc. If the energy values are not substantially identical, then one value is higher than the other value, and control signal 244 is used to adjust the tuning frequency of analog filter 204 higher or lower towards the desired frequency fc.

Thus, in this embodiment, instead of trying to determine a complete estimate of the noise transfer function of modulator 202, as done in signal processing device 450, signal processing device 550 is used to determine a property of modulator signal 216 related to the energy of dither signal 242 processed by modulator 202.

Exemplary Operation

Figure 6:
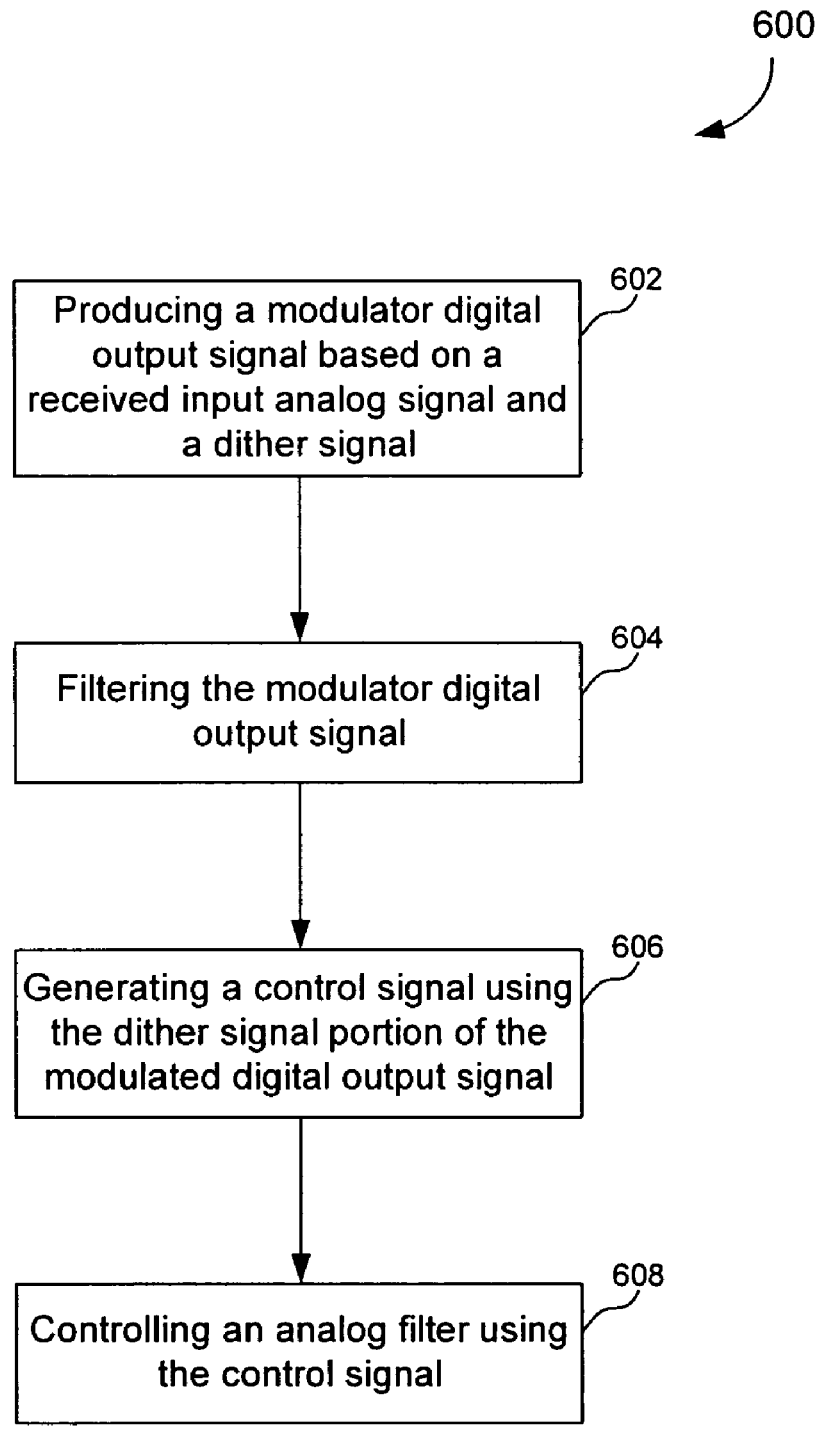
FIG. 6 shows a flowchart depicting a method, according to one embodiment of the present invention.

FIG. 6 shows a flowchart depicting a method 600, according to one embodiment of the present invention. In step 602, a modulator digital output signal is produced based on a received input analog signal and a dither signal. In step 604, the modulator digital output signal is filtered, such that a portion of the modulated digital output signal related to the dither signal is measurable. In step 606, a control signal is generated using the dither signal portion of the modulated digital output signal. In step 608, an analog filter is controlled using the control signal. For example, the analog filter can be used to produce a filtered signal from the analog signal. The filtered signal can be used to produce the modulator digital output signal.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A system, comprising:
   a dither device that produces a dither signal;
   a filter system that receives an analog input signal, a control signal and the dither signal, and produces a digital output signal therefrom; and
   a control system that receives a signal representative of the digital output signal and the dither signal, and produces a control signal therefrom, the control system including,
      a signal processing device that receives at least one of the signal representative of the digital output signal and the dither signal, and produces a processed signal therefrom, and
      a controller that receives the processed signal, and produces the control signal therefrom, wherein the controller adjusts generation of the digital output signal, which is generated from the analog input signal and the dither signal.

2. The system of claim 1, wherein the dither device comprises an analog dither device and the dither signal comprises an analog dither signal.

3. The system of claim 1, wherein the dither device comprises a digital dither device and the dither signal comprises a digital dither signal.

4. The system of claim 1, wherein:
   the filter system is a continuously tuned analog filter system; and
   the control system is in a feedback loop coupled between the output of the filter system and the control input of the filter system.

5. The system of claim 1, wherein the in the control system filter comprises:
   a summer;
   an adaptive filter;
   a finite impulse response adaptation device; and
   an infinite impulse response adaptation device.

6. The system of claim 5, wherein:
   the adaptive filter receives the dither signal and output signals from the finite impulse response adaptation device and from the infinite impulse response adaptation device and outputs an adaptive filter signal;
   the summer receives the signal representative of the digital output signal and the adaptive filter signal and outputs a combination signal;
   the finite impulse response adaptation device receives the combination signal;
   the infinite impulse response adaptation device receives the adaptive filter signal and the combination signal; and
   the filter signal received by the controller includes both the output signals from the finite impulse response adaptation device and the infinite impulse response adaptation device.

7. The system of claim 6, further comprising:
   a feedback path filter positioned to filter both the dither signal and the signal representative of the digital output before the dither signal and the signal representative of the digital output are received by the filter in the controller.

8. The system of claim 5, wherein the finite impulse response and the infinite impulse response adaptation devices comprise least mean square adaptation devices.

9. The system of claim 1, wherein the filter in the control system comprises first and second bandpass filters.

10. The system of claim 1, wherein:
the filter in the control system receives a plurality of the at least one of (a) the signal representative of the digital output signal and (b) the dither signal, and produces a filtered signal therefrom, and
the controller receives a plurality of the filtered signal, and produces the control signal therefrom.

11. The system of claim 1, wherein the signal representative of the digital output comprises one of the digital output signal, a filtered version of the digital output signal, and a delayed version of the digital output signal.

12. The system of claim 1, wherein the filter system is in a sigma delta modulator analog to digital converter.

13. The system of claim 1, wherein:
the filter system is a discretely tuned analog filter system; and
the control system is in a feedback loop coupled between the output of the filter system and the control input of the filter system.

14. The system of claim 1, wherein the in the control system filter comprises:
a summer;
an adaptive filter; and
at least one of a finite impulse response adaptation device and an infinite impulse response adaptation device.

15. A system, comprising:
a digital signal device that produces a first digital signal;
a filter system that receives an analog input signal, a control signal and the first digital signal, and produces a second digital signal therefrom; and
a control system that receives a signal representative of the second digital signal and the first digital signal, and produces the control signal therefrom, the control system including,
a signal processing device that receives at least one of the signal representative of the second digital signal and the first digital signal, and produces a processed signal therefrom, and
a controller that receives the processed signal, and produces the control signal therefrom wherein the controller adjusts generation of the digital output signal, which is generated from the analog input signal and the dither signal.

16. The system of claim 15, wherein the first digital signal is a digital dither signal.

17. A method, comprising:
(a) producing a modulator digital output signal based on a received input analog signal and a dither signal;
(b) filtering the modulator digital output signal, such that a portion of the modulated digital output signal related to the dither signal is measurable;
(c) generating a control signal using the dither signal portion of the modulated digital output signal; and
(d) controlling an analog filter using the control signal, the analog filter being used to produce a filtered signal from the analog signal, the filtered signal being used to produce the modulator digital output signal.

18. The method of claim 17, further comprising:
digitally processing the modulator digital output signal before step (b) to produce one of a delayed modulator digital output signal and a filtered modulator digital output signal.

19. The method of claim 17, wherein step (b) comprises performing least means squares filtering techniques.

20. The method of claim 17, wherein step (b) comprises performing band pass filtering.

* * * * *